United States Patent
Ekbote et al.

(10) Patent No.: US 6,706,605 B1
(45) Date of Patent: Mar. 16, 2004

(54) TRANSISTOR FORMED FROM STACKED DISPOSABLE SIDEWALL SPACER

(75) Inventors: Shashank S. Ekbote, Irving, TX (US); Freidoon Mehrad, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/403,065

(22) Filed: Mar. 31, 2003

(51) Int. Cl.$^7$ ............................................ H01L 21/336
(52) U.S. Cl. .................. 438/305; 438/307; 438/595
(58) Field of Search .............................. 438/303, 305, 438/306, 307, 527, 529, 595

(56) References Cited

U.S. PATENT DOCUMENTS

| | | | | |
|---|---|---|---|---|
| 4,843,023 A | * | 6/1989 | Chiu et al. ................... | 438/305 |
| 5,171,700 A | * | 12/1992 | Zamanian .................... | 438/307 |
| 5,793,089 A | * | 8/1998 | Fulford et al. ............... | 257/408 |
| 6,261,913 B1 | * | 7/2001 | Akram et al. ................. | 438/305 |
| 6,316,302 B1 | * | 11/2001 | Cheek et al. ................. | 438/307 |

* cited by examiner

Primary Examiner—Chandra Chaudhari
(74) Attorney, Agent, or Firm—Yingsheng Tung; Wade James Brady, III; Frederick J. Telecky, Jr.

(57) ABSTRACT

A method of forming an integrated circuit transistor (80), comprising providing a semiconductor region (90) and forming a gate structure (92, 94) in a fixed position relative to the semiconductor region. The gate structure has a first sidewall (94*a*) and a second sidewall (94*b*). The method also comprises first, forming a first layer (96) adjacent the first sidewall and the second sidewall, and second, forming a second layer (98) adjacent the first layer. The method also comprises third, forming a third layer (100) adjacent the second layer, and fourth, forming a fourth layer (102) adjacent the third layer. The method also comprises fifth, implanting a first and second source/drain region (106*a*, 106*b*) in the semiconductor region and at a first distance laterally with respect to the gate structure, wherein a combined thickness of the first, second, third, and fourth layers determines the first distance. The method also comprises sixth, removing the third and fourth layers, and seventh, implanting a third and fourth source/drain region (108*a*, 108*b*) in the semiconductor region and at a second distance laterally with respect to the gate structure, wherein the second distance is less than the first distance.

17 Claims, 5 Drawing Sheets

TRANSISTOR FORMED FROM STACKED DISPOSABLE SIDEWALL SPACER

CROSS-REFERENCES TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present embodiments relate to electronic circuits and are more particularly directed to an electronic circuit transistor (or transistors) formed from a stacked disposable sidewall spacer.

Semiconductor devices are prevalent in all aspects of electronic circuits, and an often critical and dominant element used in such circuits is the transistor. Thus, due to the evolution of electronic design and its criteria, considerable effort has been made to improve transistor design, including accommodating the ongoing effort to reduce device dimensions. During this history, both a conventional sidewall spacer process and a disposable sidewall spacer process have been developed, where in each case and as known in the art the sidewall spacers are used to align the source/drain implant regions of the transistor relative to the transistor gate. However, the conventional and disposable sidewall spacer processes have various attributes that can be improved upon, which is explored later after an introduction to these two known technologies.

In the known art of conventional transistor sidewall spacers and as further detailed later, after the transistor gate is formed, so-called lightly doped source/drain ("LDD") regions are implanted into the underlying semiconductor region and self-aligned relative to both sides of the gate, where the average dopant concentration of the dopant profile in these regions is less than that of the deep source/drain regions that are implanted into the underlying semiconductor region at a lateral distance from the gate that is greater than that of the location of the LDD regions. More recently, the dopant concentration in these LDD regions has been increased and, hence, such regions are now more commonly referred to as medium doped source/drain ("MDD") regions. Thus, for sake of consistency in the remainder of this document, the more contemporary example of MDD regions will be used. After the MDD regions are implanted, the device is annealed to thereby cause lateral extension of the MDD regions into the area below the gate. Thereafter, sidewall spacers are formed on the two gate sidewalls and the deep source/drain regions are implanted into the underlying semiconductor region, with the deep source/drain region implant self-aligning to the sidewall spacers. Thereafter, the deep source/drain regions are annealed. Note, therefore, because the MDD regions were previously formed, then the anneal directed to the deep source/drain regions necessarily exposes the previously-formed MDD regions to a second anneal (having been annealed once earlier after the implant of the MDD regions). The transistor art has recognized that the effect of this second anneal on the MDD regions may degrade the source/drain junction of the transistor and otherwise undesirably affect the transistor performance.

In the known art of transistor disposable sidewall spacers, two different flows are known, namely, a composite disposable sidewall spacer flow and an all nitride disposable sidewall spacer flow. Each of these processes is further described later, but at this point certain preliminary aspects are noted. Specifically, with respect to the disposable sidewall spacer flows, the second anneal exposure of the transistor MDD regions as described above with respect to the conventional process is avoided. Particularly, in the disposable sidewall spacer art, first a disposable sidewall spacer is formed on the outsides of the two gate sidewalls and the deep source/drain regions are then implanted, self-aligned to the respective disposable sidewall spacers, followed by an anneal of the deep source/drain regions. Thereafter, the disposable sidewall spacers are removed, hence giving rise to the name "disposable." Next, the MDD regions are implanted and then annealed. Note, therefore, that the MDD regions are formed after the deep source/drain regions and, thus, the MDD regions do not incur the anneal of the earlier-formed deep source/drain regions; consequently, there is one less exposure of the MDD regions to an anneal as compared to the conventional process. This provides a more abrupt MDD profile, which is beneficial in reducing the transistor leakage. Further, the source/drain anneal can be tuned without concern of the MDD regions, whereas in the conventional process, since the source/drain anneal is known to also affect the MDD regions, then its parameters are typically adjusted with some consideration also to the effect that anneal will have on the MDD regions. As another benefit of the disposable sidewall spacer approach, a higher temperature source/drain region anneal may be performed, creating reduced dopant depletion in the gate. As known in the art, this improves (i.e., lowers) $T_{OX,INV}$, where that reflects the desired goal of having sufficient dopants in the gate so as to reduce or avoid a capacitance that otherwise would add to the capacitance of the gate oxide, thereby degrading device performance. As still another benefit of the disposable sidewall spacer approach, the two anneals incurred by the deep source/drain regions grade the source/drain region junctions more than the conventional process, providing better diode characteristics. Still other benefits are known in the art.

While the preceding approaches to transistor formation have yielded many satisfactory integrated circuits, the present inventors have observed that these approaches also may be improved. Thus, in view of the above, there arises a need to address the drawbacks of the prior art, as is achieved by the preferred embodiments described below.

BRIEF SUMMARY OF THE INVENTION

In the preferred embodiment, there is a method of forming an integrated circuit transistor, comprising providing a semiconductor region and forming a gate structure in a fixed position relative to the semiconductor region. The gate structure has a first sidewall and a second sidewall. The method also comprises first, forming a first layer adjacent the first sidewall and the second sidewall, and second, forming a second layer adjacent the first layer. The method also comprises third, forming a third layer adjacent the second layer, and fourth, forming a fourth layer adjacent the third layer. The method also comprises fifth, implanting a first and second source/drain region in the semiconductor region and at a first distance laterally with respect to the gate structure, wherein a combined thickness of the first, second, third, and fourth layers determines the first distance. The method also comprises sixth, removing the third and fourth layers, and seventh, implanting a third and fourth source/drain region in the semiconductor region and at a second distance laterally with respect to the gate structure, wherein the second distance is less than the first distance.

Other aspects are also disclosed and claimed.

DETAILED DESCRIPTION OF THE INVENTION

Figure 1A:
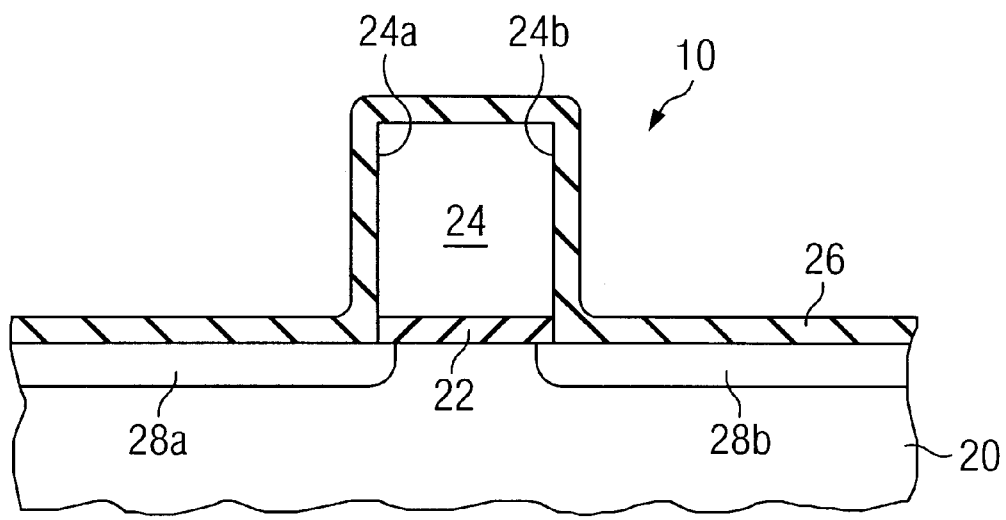
FIG. 1a illustrates a cross-sectional view of a prior art integrated circuit semiconductor device demonstrating the formation of a conventional sidewall spacer transistor, including the formation of a gate and an overlying insulating layers, with MDD regions formed in the underlying semiconductor region.

FIG. 1a illustrates a cross-sectional view of a prior art integrated circuit semiconductor device 10, where device 10 and the later discussion demonstrate in part the formation of a conventional sidewall spacer transistor. Device 10 is formed in connection with a semiconductor region 20, typically provided as a semiconductor substrate or a region (e.g., a well) formed within such a substrate. A gate oxide 22 is formed over semiconductor region 20, and a polysilicon gate 24 is formed over gate oxide 22. An oxide layer 26 is formed over the gate 24 and extends vertically along the sidewalls 24a and 24b of gate 24; further, oxide layer 26 extends laterally in both directions away from gate 24 and along the upper surface of semiconductor region 20, where these areas are sometimes referred to in the art as a moat region. Typically, oxide layer 26 is on the order of 150 Å thick. Next, a dopant implant is performed with respect to device 10, thereby implanting MDD regions 28a and 28b through oxide layer 26 in the moat region and into the upper surface of semiconductor region 20. Initially, regions 28a and 28b self-align with respect to the outer edges of oxide layer 26 on sidewalls 24a and 24b; however, thereafter an anneal is performed, which causes the dopants of regions 28a and 28b to migrate laterally such that they extend partially under the area immediately below gate 24. Note also that the source/drain region implant also implants dopants into gate 24, thereby improving its $T_{OX,INV}$ so as to reduce a capacitance that otherwise would add to the capacitance of gate oxide 22.

Figure 1B:
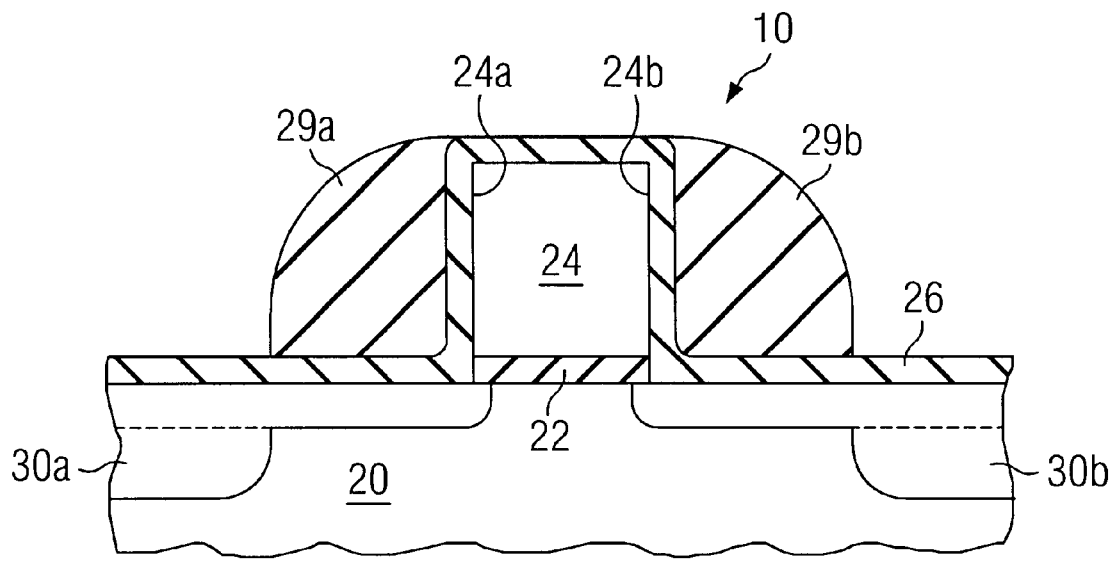
FIG. 1b illustrates the prior art integrated circuit semiconductor device of FIG. 1a with the addition of oxide sidewall spacers and the implanted deep source/drain regions.

FIG. 1b illustrates device 10 of FIG. 1a after additional processing steps. Specifically, in FIG. 1b device 10 includes two sidewall spacers 29a and 29b, each separated from a respective sidewall 24a and 24b of gate 24 by oxide layer 26. Typically, sidewall spacers 29a and 29b are formed by first depositing a layer of insulating material (not shown) over device 10, and then anisotropically etching that layer to form sidewall spacers 29a and 29b. The thickness of this insulating layer is selected to provide a desired thickness in the resulting sidewall spacers 29a and 29b. Next, a dopant implant is performed, which thereby implants dopants into the moat areas outside of the sidewall spacers 29a and 29b, thereby forming deep source/drain regions 30a and 30b. Further, note that this implant step also implants dopants into gate 24, thereby reducing its $T_{OX,INV}$. Finally, an anneal is performed of the dopants of deep source/drain regions 30a and 30b; however, as also described earlier in the Background Of The Invention section of this document, this anneal also affects the previously-formed MDD regions 28a and 28b, with the potentially undesirable effects described earlier.

Figure 2A:
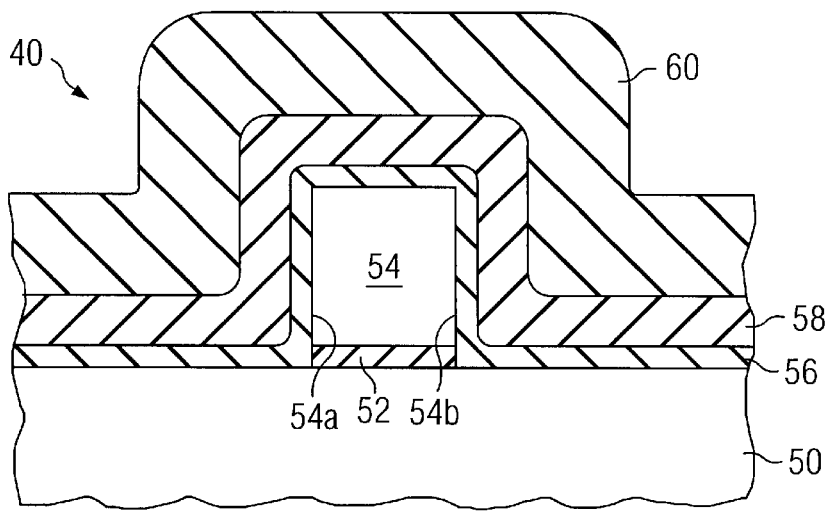
FIG. 2a illustrates a cross-sectional view of a prior art integrated circuit semiconductor device demonstrating the formation of a composite disposable sidewall spacer transistor, including the formation of a gate and an overlying oxide, with a nitride layer and an overlying oxide layer to be etched to form, in part, the disposable sidewall spacers.

FIG. 2a illustrates a cross-sectional view of a prior art integrated circuit semiconductor device 40, where device 40 and the later discussion demonstrates in part the formation of a disposable composite sidewall spacer transistor. Device 40 is formed in connection with a semiconductor region 50, which like device 10 is typically provided as a semiconductor substrate or a region within such a substrate. A gate oxide 52 is formed over semiconductor region 50, and a polysilicon gate 54 is formed over gate oxide 52. An oxide layer 56, typically on the order of 10 to 60 Å thick, is formed over gate 54 and extends vertically along the sidewalls 54a and 54b of gate 54 and also laterally away from gate 54 into the moat regions. Unlike the conventional device 10 in FIG. 1a, however, note that after the formation of oxide layer 56 there is not an immediate dopant implant to form MDD regions, but instead those regions are formed after various additional process steps as detailed below. Continuing then with device 40, a nitride layer 58 and an oxide layer 60 are formed, where these two layers later provide portions of a composite sidewall spacer that defines the lateral distance of a deep source/drain implant from gate 54. Looking first to nitride layer 58, it is typically on the order of 150 to 300 Å thick and is formed over oxide layer 56, where nitride layer 58 may be formed by a liquid plasma chemical vapor deposition ("LPCVD") or a reduced temperature chemical vapor deposition ("RTCVD") process. Thereafter, oxide layer 60, typically on the order of 400 to 800 Å thick, is formed over oxide layer 56, where oxide layer 60 may be formed by an RTCVD or TEOS process.

Figure 2B:
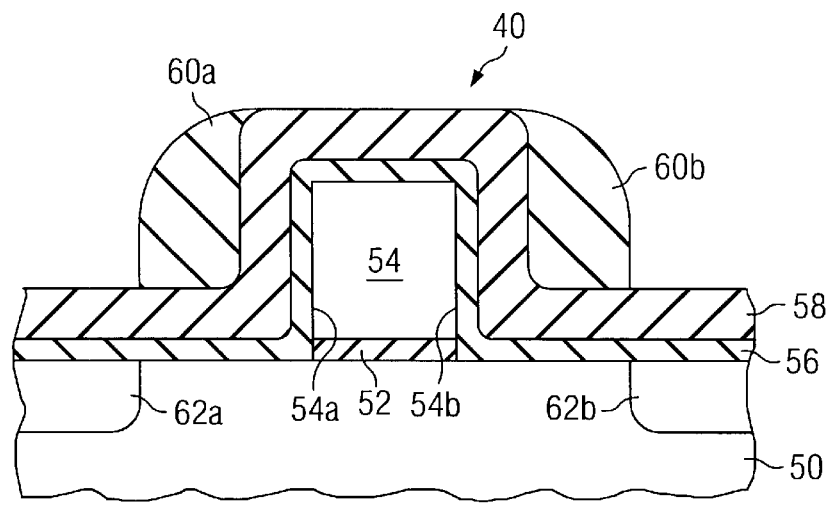
FIG. 2b illustrates the prior art integrated circuit semiconductor device of FIG. 2a after the etch of the uppermost oxide layer to form the disposable sidewall spacers, and also after the implant of the deep source/drain regions.

FIG. 2b illustrates device 40 of FIG. 2a after an anisotropic etch of oxide layer 60, thereby leaving two sidewall spacers 60a and 60b, each separated from a respective sidewall 54a and 54b of gate 54, by both nitride layer 58 and oxide layer 56. Next, a dopant implant is performed, which thereby implants dopants into the moat areas outside of the sidewall spacers 60a and 60b, thereby forming deep source/drain regions 62a and 62b. Further, note that this implant step also implants dopants into gate 54. However, for all of these implants, note that they must pass through not only oxide layer 56, but also through nitride layer 58. As known in the art, the stopping power of these two different materials, with respect to the implanted dopants, is different, and so one drawback of this composite disposable sidewall approach is the required tuning of the implant to accommodate these two different stopping powers, while still achieving adequate device performance from the resulting deep source/drain regions. Further, fewer dopants may reach gate 54 as compared to the conventional device 10 in FIGS. 1a and 1b, thereby undesirably increasing the $T_{OX,INV}$ of gate 54 relative to that of gate 24. After the formation of deep source/drain regions 62a and 62b, device 40 is annealed to further diffuse the dopants of those regions.

Figure 2C:
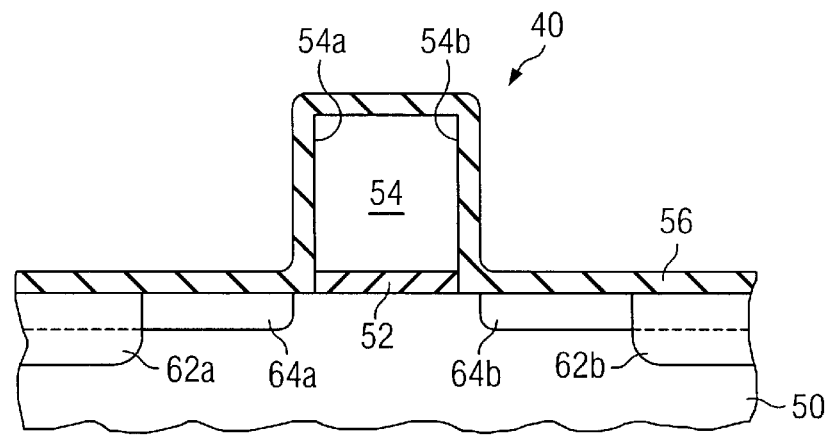
FIG. 2c illustrates the prior art integrated circuit semiconductor device of FIG. 2b after the removal of various layers and the implant of the MDD regions.

FIG. 2c illustrates device 40 of FIG. 2b after additional processing steps. Specifically, comparing FIGS. 2b and 2c, first sidewall spacers 60a and 60b are removed, followed by a removal of nitride layer 58. The removal of nitride layer 58 is typically achieved with a hot phosphoric acid ($H_3PO_4$) wash. Note also in this regard, therefore, that as nitride layer 58 is removed by the $H_3PO_4$, the $H_3PO_4$ also contacts the upper surface of oxide layer 56, and oxide layer 56 is also subject to degradation in response to the $H_3PO_4$, albeit at a slower rate as compared to the nitride of layer 58. Further, recall that oxide layer 56 is on the order of 10 to 60 Å thick; due to this thickness as well as the extent of the $H_3PO_4$ wash, there is the possibility that oxide layer 56 will be completely penetrated at certain locations, where such penetration therefore damages the underlying semiconductor material, which could be either gate 54 or semiconductor region 50. Of course, such damage is undesirable as it negatively affects the performance of the ultimate transistor device. Completing FIG. 2c, after the $H_3PO_4$ wash, MDD regions 64a and 64b are implanted through oxide layer 56 in the moat regions. Although not shown, those MDD regions 64a and 64b are then annealed; further, since MDD regions 64a and 64b are formed after deep source/drain regions 62a and 62b, then MDD regions 64a and 64b do not encounter the previous anneal of source/drain regions 62a and 62b.

Figure 3A:
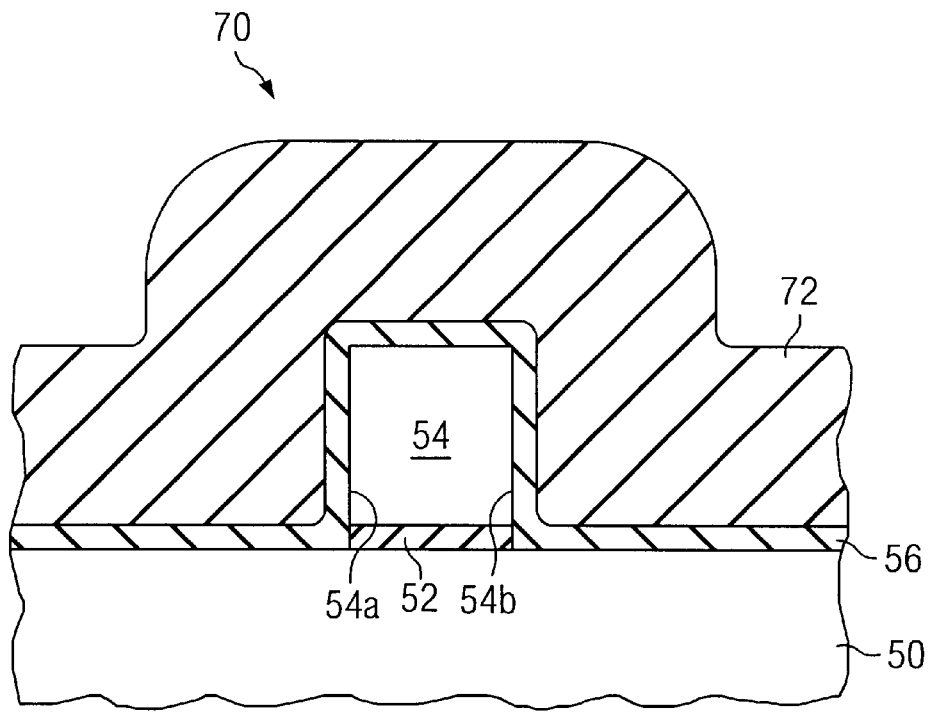
FIG. 3a illustrates a cross-sectional view of a prior art integrated circuit semiconductor device demonstrating the formation of an all nitride disposable sidewall spacer transistor, including the formation of a gate and an overlying oxide, with an overlying nitride layer to be etched to form the disposable sidewall spacers.

FIG. 3a illustrates a cross-sectional view of a prior art integrated circuit semiconductor device 70, where device 70 and the later discussion demonstrate in part the formation of an all nitride disposable sidewall spacer transistor. Device 70 includes certain of the same regions and layers as that of device 40 shown in FIGS. 2a through 2c and, thus, for those items like reference numbers are carried forward into FIG. 3a and the reader is assumed familiar with the earlier discussion. Briefly, therefore, device 70 is formed in connection with a semiconductor region 50, on top of which is formed a gate oxide 52 and a polysilicon gate 54, and an oxide layer 56 is formed over the entire device. Continuing then with device 70, a nitride layer 72 is formed over the entire device, where nitride layer 72 later provides a portion of a sidewall spacer that defines the lateral distance from gate 54 of a deep source/drain implant. Typically, nitride layer 72 is on the order of 400 to 800 Å thick, and nitride layer 72 may be formed by an LPCVD or RTCVD process.

Figure 3B:
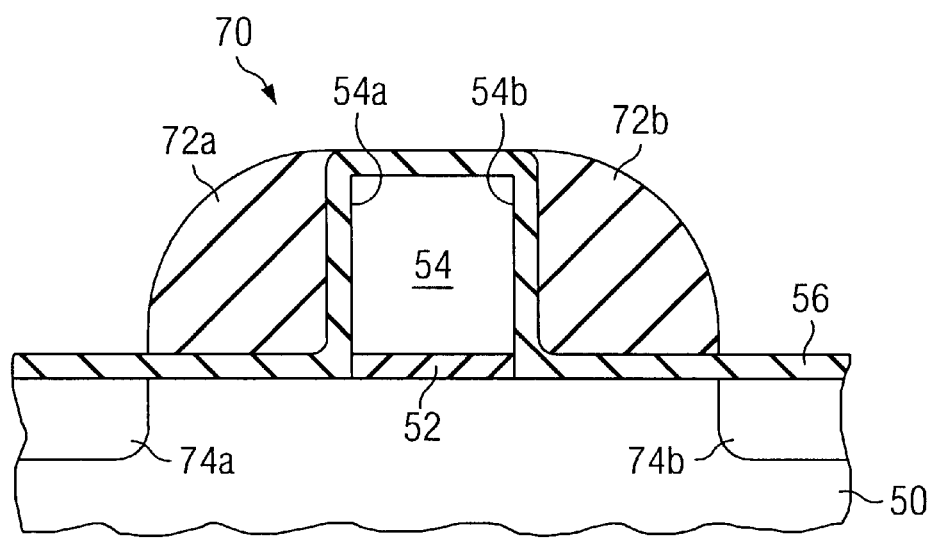
FIG. 3b illustrates the prior art integrated circuit semiconductor device of FIG. 3a after the etch of the uppermost nitride layer to form the disposable sidewall spacers, and also after the implant of the deep source/drain regions.

FIG. 3b illustrates device 70 of FIG. 3a after an anisotropic etch of nitride layer 72, thereby leaving disposable nitride sidewall spacers 72a and 72b. After the etch, deep source/drain regions 74a and 74b are implanted, followed by an anneal of those regions, which will cause those regions to extend laterally under spacers 72a and 72b (not shown in FIG. 3b). Thereafter, disposable nitride sidewall spacers 72a and 72b are stripped, typically using an $H_3PO_4$ wash. However, and as introduced earlier in the Background Of The Invention section of this document, due to the relatively thinness of oxide layer 56, the $H_3PO_4$ wash can penetrate it and attack the underlying semiconductor region 50. In any event, once the disposable nitride sidewall spacers 72a and 72b are removed, MDD regions may be formed as known in the art.

Figure 4A:
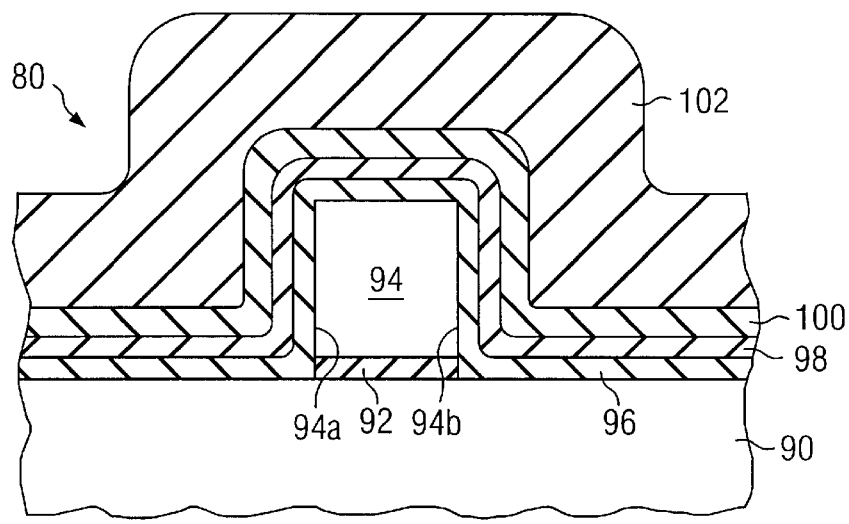
FIG. 4a illustrates a cross-sectional view of a the preferred embodiment integrated circuit semiconductor device demonstrating the formation of a disposable stacked sidewall spacer transistor, including the formation of a gate and an overlying oxide, along with four layers on top of the gate.

FIG. 4a illustrates a cross-sectional view of an integrated circuit semiconductor device 80, in accordance with the inventive preferred embodiments and presenting a disposable sidewall transistor. A few of the layers and regions in device 80 are comparable to the flow in the prior art and, thus, for such items a lesser amount of detail is provided as various background was presented above and still other aspects will be appreciated by one skilled in the art. Looking briefly to such aspects in FIG. 4a, device 80 is formed in connection with a semiconductor region 90, which may be either a semiconductor substrate or a region (e.g., a well) within such a substrate. A gate oxide 92 is formed over semiconductor region 90, and a polysilicon gate 94 is formed over gate oxide 92. An oxide layer 96, preferably on the order of 10 to 60 Å thick, is formed over gate 94 and extends vertically along the sidewalls 94a and 94b of gate 94 and also laterally away from gate 94 into the moat regions.

Continuing with FIG. 4a, but now looking to layers that differ in materials, thickness, or presence as compared to the prior art, a nitride layer 98 is formed over oxide layer 96. In the preferred embodiment, nitride layer 98 is on the order of 30 to 50 Å thick and is preferably formed using one of known processes, such as an LPCVD or RTCVD process. Note, therefore, in contrast to the composite disposable device 40 of FIG. 2b, nitride layer 98 of the preferred embodiment is considerably thinner than the 150 to 300 Å thick nitride layer 58 in FIG. 2b. Continuing with FIG. 4a, an oxide layer 100 is formed over nitride layer 98. In the preferred embodiment, oxide layer 100 is on the order of 100 to 150 Å thick and is formed by depositing the oxide; the deposition process may be one selected by one skilled in the art such as through an RTCVD or TEOS process. Note also in contrast to the composite disposable device 40 of FIG. 2b, oxide layer 100 is preferably thinner than the 400 to 800 Å thick oxide layer 60 in FIG. 2b. Lastly, a nitride layer 102 is formed over oxide layer 100. In the preferred embodiment, nitride layer 102 is on the order of 400 to 800 Å thick and is formed using an LPCVD process. As further appreciated below, note that the thickness of nitride layer 102 combines with the thickness of layers 98 and 100 and also with the thickness of layer 96, all extending outward from sidewalls 94a and 94b, to later define the distance of implant separation between the deep source/drain regions and gate 94, that is, this combined thickness provides a screen from the dopants reaching semiconductor region 90.

Figure 4B:
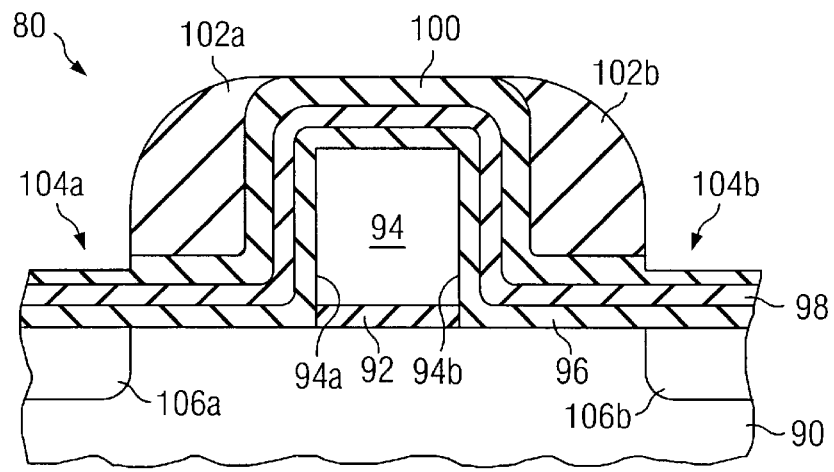
FIG. 4b illustrates the preferred embodiment integrated circuit semiconductor device of FIG. 4a after the etch of the uppermost nitride layer to form, in part, the disposable sidewall spacers, and also after the implant of the deep source/drain regions.

FIG. 4b illustrates device 80 of FIG. 4a after an anisotropic etch of nitride layer 102, thereby leaving two nitride sidewall spacers 102a and 102b, each separated from a respective sidewall 94a and 94b of gate 94 by three layers, namely, by oxide layer 100, nitride layer 98, and oxide layer 96. Note that this etch stops on oxide layer 100 and, indeed, in areas 104a and 104b oxide layer 100 may be partially etched by the same etch process that etches nitride layer 102; this partial etch, however, poses no risk to the upper surface of region 90 because some thickness of oxide layer 100 remains and, moreover, there are the additional nitride layer 98 and oxide layer 96 underlying oxide layer 100. This is in contrast to device 70 of FIG. 3b wherein the etch of nitride layer 72 can penetrate oxide layer 56, thereby exposing and damaging the upper surface of semiconductor region 50. Returning to FIG. 4b, after the etch of layer 102, the deep source/drain implant(s) is performed to form deep source/drain regions 106a and 106b. The implant is of the appropriate desired conductivity type (i.e., p-type or n-type), and typically it is a complementary conductivity type as compared to the conductivity type of semiconductor region 90. Also in connection with this implant, and by way of example, assume in regions 104a and 104b that oxide layer 100 was etched to leave 50 Å of the oxide material. Thus, the dopants for the deep source/drain implant pass through this 50 Å of oxide, as well as the 30 to 50 Å of nitride layer 98 and the 10 to 60 Å of oxide of layer 96. Further, as known in the art, a thickness of nitride presents a stopping power with respect to the dopant implant of approximately ⅔ of that of oxide, so the 30 to 50 Å of nitride layer 98 provides a stopping power equivalent to that of approximately 45 to 75 Å of oxide. Thus, assuming that in the present example oxide layer 96 is 50 Å thick, then the source/drain implant incurs a stopping power as presented by an equivalent on the order of a total 145 to 175 Å of oxide. This range is comparable to that of the 150 Å thick oxide layer 26 of the conventional sidewall spacer device 10 of FIGS. 1a and 1b. Thus, the extent of the dopant penetration is comparable to that of the conventional sidewall spacer device 10, whereas the preferred embodiment provides a disposable sidewall structure device with the various benefits that a disposable sidewall structure provides as compared to a conventional approach. Further, note that the dopant penetration in the preferred embodiment is also improved as compared to device 40 of FIGS. 2a and 2b, because in that latter approach, the deep source/drain implant was required to penetrate a nitride layer 58 on the order of 150 to 300 Å thick, thereby requiring a greater energy to sufficiently implant the dopants. Further, the barrier provided by that nitride layer 58 is also provided on top of the gate 54, thereby preventing dopants from reaching as deep vertically within gate 54, whereas in contrast in the preferred embodiment these dopants encounter a material with a lower stopping power and, hence, penetrate from the top downward of gate 94 closer to gate oxide 92, thereby improving the $T_{OX,INV}$ of device 80. Finally, in one alternative of the preferred embodiment, an anneal is then performed so as to affect the deep source/drain regions 106a and 106b.

Figure 4C:
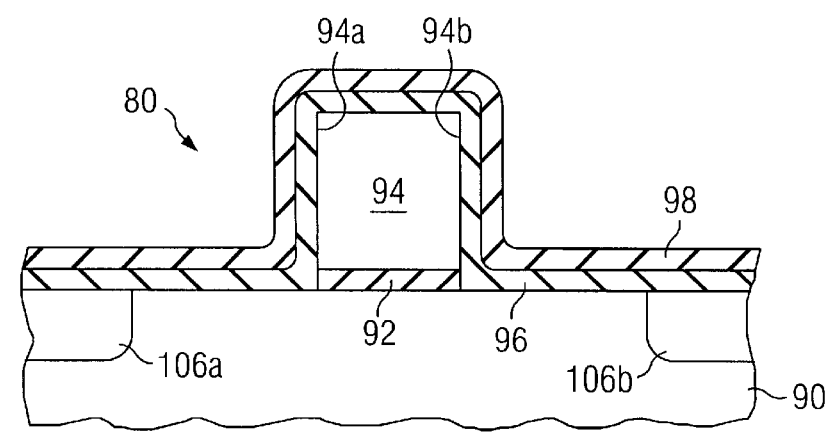
FIG. 4c illustrates the preferred embodiment integrated circuit semiconductor device of FIG. 4b after the removal of the disposable nitride spacers and an underlying oxide layer.

FIG. 4c illustrates device 80 of FIG. 4b after two additional processing steps. First, nitride sidewall spacers 102a and 102b (see FIG. 4b) are removed, which in the preferred embodiment is achieved by with an $H_3PO_4$ wash. Note also in this regard, that as this nitride material is removed, the $H_3PO_4$ does not contact semiconductor region 90 as there are various intervening layers, including oxide layer 100, nitride layer 98, and oxide layer 96. Further, as an alternative to performing the anneal of source/drain regions 106a and 106b before this $H_3PO_4$ wash, in a different embodiment such an anneal may be performed after that wash, that is, after the removal of nitride spacers 102a and 102b. Second, oxide layer 100 is removed, which in the preferred embodiment is achieved using a dilute or buffered HF process. During this latter step, and due to the presence of nitride layer 98, gate 94 and polysilicon region 90 are protected from the HF strip.

Figure 4D:
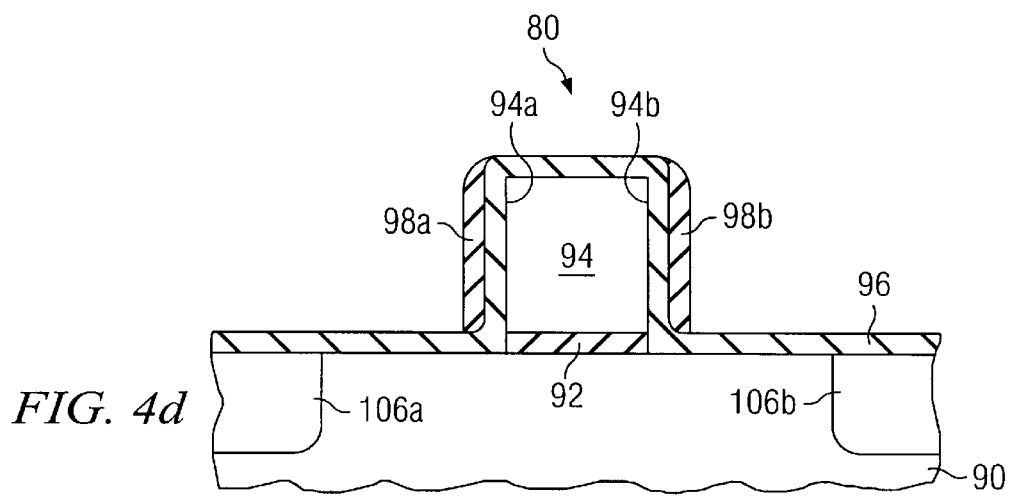
FIG. 4d illustrates the preferred embodiment integrated circuit semiconductor device of FIG. 4c after an etch of the uppermost nitride layer.

FIG. 4d illustrates device 80 of FIG. 4c after an additional processing step. Specifically, nitride layer 98 is etched, and in the preferred embodiment the etch is a reactive ion etch ("RIE"). This etch removes nitride layer 98 in the moat regions as well as from the top of gate 94. Thus, at this point, one skilled in the art will appreciate that the remaining portions 98a and 98b of nitride layer 98, along with the thickness of oxide layer 96, both along sidewalls 94a and 94b of gate 94, provide a spacer to permit the implant of MDD regions (shown below). Thus, the thickness of layer 98, as formed and discussed earlier in connection with FIG. 4a, may be adjusted so as to provide a desired resulting thickness for remaining portions 98a and 98b.

Figure 4E:
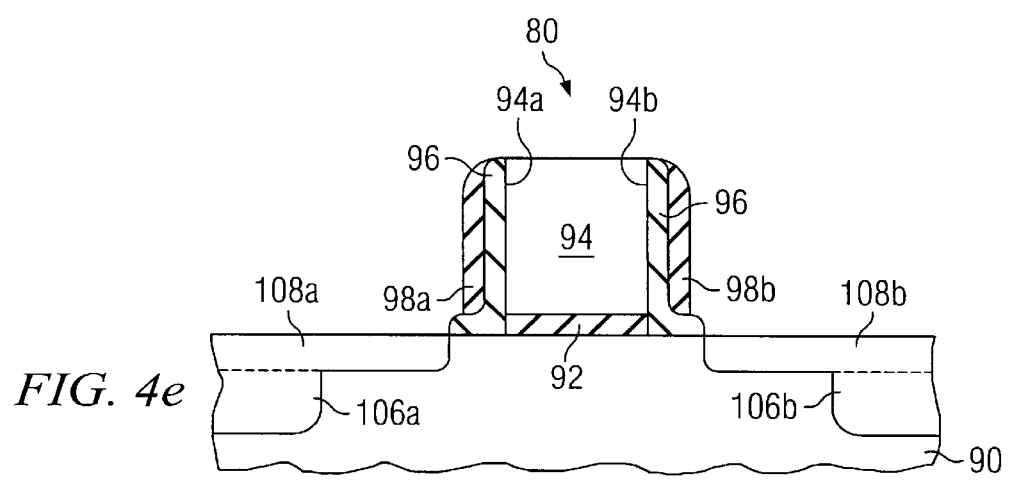
FIG. 4e illustrates the preferred embodiment integrated circuit semiconductor device of FIG. 4d after the implant of the MDD regions.

FIG. 4e illustrates device 80 of FIG. 4d after additional processing steps. First, oxide layer 96 is anisotropically etched, thereby exposing the top surface of gate 94 and also the upper surface of semiconductor region 90 (including the deep source/drain regions 106a and 106b formed therein). Next, a dopant implant is performed to form MDD regions 108a and 108b. As with previously described dopant implants, the implant may be either of an n-type or p-type implant. The illustration of FIG. 4e demonstrates that this implant self-aligns with respect to the remaining portions 98a and 98b of nitride layer 98 as well as to the footings that are formed in layer 96 near the bottom of gate 94. Preferably, while the deep source/drain regions 106a and 106b were implanted at a lateral distance from gate 94 that includes the thickness of layers 96, 98, 100, and 102, MDD regions 108a and 108b are implanted at a relatively shorter lateral distance from gate 94 that includes the thickness of only layers 96 and 98, where those layers have remained after the removal of the disposable layers 100 and 102.

Figure 4F:
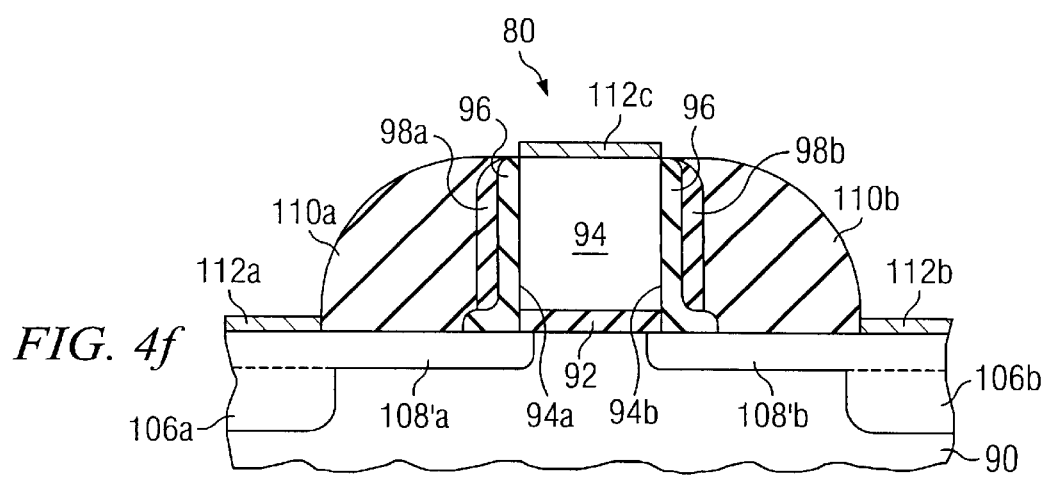
FIG. 4f illustrates the preferred embodiment integrated circuit semiconductor device of FIG. 4e after the anneal of the MDD regions and the formation of various silicide regions.

FIG. 4f illustrates device 80 of FIG. 4e after additional processing steps. First, an anneal is performed, preferably as a spike or refined spike anneal, thereby causing the dopants in MDD regions 108a and 108b to migrate laterally and to thereby extend in part below gate 94; thus, in FIG. 4e and for sake of distinction, these regions are labeled as MDD regions 108'a and 108'b. Note also that this anneal of MDD regions 108a and 108b is consistent with one of the above-described benefits provided by a disposable sidewall transistor, that is, the MDD regions are exposed to this anneal while not being exposed to the earlier anneal performed with respect to deep source/drain regions 106a and 106b. Thereafter, additional conventional steps may be followed to complete the transistor device. For example, FIG. 4f illustrates the inclusion of silicide spacers 110a and 110b, preferably formed by depositing and etching an insulating material, followed by a silicidation which forms silicide regions 112a and 112b on top of the exposed upper portions of MDD regions 108'a and 108'b, as well as a silicide region 112c on top of gate 94.

From the above, it may be appreciated that the preferred embodiments provide an integrated circuit device that includes a transistor (or transistors), where the transistor is formed from a stacked disposable sidewall spacer. In the preferred embodiment, the disposable sidewall spacer includes at least four layers that provide a combined thickness separating the gate sidewalls from the location at which the deep source/drain region is first implanted into the underlying semiconductor region; the spacer is disposable in the sense that a portion of it, namely nitride layer 102 and oxide layer 100 is subsequently removed (i.e., disposed of) prior to forming the MDD regions. Moreover, the various layers and the preferred materials provide various benefits. For example, the use of oxide layer 96 and nitride layer 98 permits a deep source/drain implant process that is quite similar to that in conventional flow processes without concerns about the lower diode breakdown voltages or higher junction leakages that might otherwise occur with larger divergence from the conventional process. As another example, the use of oxide layer 100 provides adequate process margin for an $H_3PO_4$ strip of nitride sidewall spacers 102a and 102b, with an added security from oxide layer 96, so as to considerably decrease the chance of the $H_3PO_4$ attacking the underlying semiconductor region 90 as well as gate 94. As yet another benefit and arising from the disposable sidewall approach in general, greater independence is permitted in varying the deep source/drain region implant parameters as well as the anneal of the deep source/drain regions given that they will not impact the subsequently-formed MDD regions. Further, the deep source/drain regions incur two anneals, one for those regions and one for the later-formed MDD regions, thereby grading the source/drain junctions more than in conventional flow and, thus, giving better diode characteristics. Further, the source/drain regions are deeper thereby reducing the junction capacitance. As yet another benefit, certain of the process parameters described herein may be adjusted by one skilled in the art, and substitutions in some materials also may be made. Thus, the preferred embodiment is able to achieve beneficial results for both PMOS and NMOS transistors. As still another advantage, while the present embodiments have been described in detail, various substitutions, modifications or alterations could be made to the descriptions set forth above without departing from the inventive scope, as is defined by the following claims.

What is claimed is:

1. A method of forming an integrated circuit transistor, comprising:

providing a semiconductor region;

forming a gate structure in a fixed position relative to the semiconductor region, the gate structure having a first sidewall and a second sidewall;

first, forming a first layer adjacent the first sidewall and the second sidewall;

second, forming a second layer adjacent the first layer;

third, forming a third layer adjacent the second layer;

fourth, forming a fourth layer adjacent the third layer;

fifth, implanting a first and second source/drain region in the semiconductor region and at a first distance laterally with respect to the gate structure, wherein a combined thickness of the first, second, third, and fourth layers determines the first distance;

sixth, removing the third and fourth layers; and seventh, implanting a third and fourth source/drain region in the semiconductor region and at a second distance laterally with respect to the gate structure, wherein the second distance is less than the first distance.

2. The method of claim 1 wherein the third and fourth source/drain regions comprise an average dopant profile concentration lesser than an average dopant profile concentration of the first and second source/drain regions.

3. The method of claim 2 wherein the second distance is determined by a thickness of the first and second layers.

4. The method of claim 3:

wherein the first and third layers comprise oxide; and wherein the second and fourth layers comprise nitride.

5. The method of claim 3:

wherein the second and fourth layers comprise nitride; and wherein the sixth step comprises removing the fourth layer with $H_3PO_4$.

6. The method of claim 5 and further comprising, between the sixth and seventh steps, annealing the first and second source/drain regions.

7. The method of claim 3 and further comprising, between the fourth and fifth steps, a step of etching the fourth layer.

8. The method of claim 3 and further comprising, between the fifth and sixth steps, annealing the first and second source/drain regions.

9. The method of claim 1 and further comprising, between the sixth and seventh steps, annealing the first and second source/drain regions.

10. The method of claim 1 wherein the first layer comprises an oxide layer approximately 50 Å thick.

11. The method of claim 1 wherein the second layer comprises a nitride layer approximately 30 to 50 Å thick.

12. The method of claim 1 wherein the third layer comprises an oxide layer approximately 100 to 150 Å thick.

13. The method of claim 1 wherein the fourth layer comprises a nitride layer approximately 750 Å thick.

14. The method of claim 1 and further comprising, eighth, annealing the third and fourth source/drain regions.

15. The method of claim 1 wherein the semiconductor region comprises a first conductivity type and wherein the first, second, third, and fourth source/drain regions each comprise a second conductivity type complementary to the first conductivity type.

16. The method of claim 1 wherein the step of forming a gate structure comprises:

forming a gate insulator adjacent the semiconductor region; and forming a polysilicon member adjacent the gate insulator and opposite of the semiconductor region.

17. A method of forming an integrated circuit transistor, comprising:

providing a semiconductor region;

forming a gate structure in a fixed position relative to the semiconductor region, the gate structure having a first sidewall and a second sidewall;

first, forming a first layer adjacent the first sidewall and the second sidewall;

second, forming a second layer adjacent the first layer;

third, forming a plurality of layers, wherein each layer in the plurality of layers is in a fixed relationship relative to the second layer;

fourth, implanting a first and second source/drain region in the semiconductor region and at a first distance laterally with respect to the gate structure, wherein a combined thickness of the first, second, and plurality of layers determines the first distance;

fifth, removing at least one of the plurality of layers; and sixth, implanting a third and fourth source/drain region in the semiconductor region and at a second distance laterally with respect to the gate structure, wherein the second distance is less than the first distance.

* * * * *